United States Patent
Machiroutu et al.

(12)

(10) Patent No.: US 6,437,983 B1
(45) Date of Patent: Aug. 20, 2002

(54) VAPOR CHAMBER SYSTEM FOR COOLING MOBILE COMPUTING SYSTEMS

(75) Inventors: Sridhar V. Machiroutu, Santa Clara; Eric Distefano, Livermore, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,507

(22) Filed: Jun. 29, 2001

(51) Int. Cl.[7] ................................................. H05H 7/20
(52) U.S. Cl. ............. 361/700; 165/104.26; 165/104.33; 174/15.2; 257/715; 361/701
(58) Field of Search ....................... 62/223; 165/104.21, 165/104.26, 104.33, 80.2–80.3, 185; 174/15.2; 257/715; 361/699, 687, 700, 701

(56) References Cited

U.S. PATENT DOCUMENTS

| | | | | | |
|---|---|---|---|---|---|
| 5,329,993 | A | * | 7/1994 | Ettehadieh | 165/104.33 |
| 6,105,662 | A | * | 8/2000 | Suzuki | 165/104.33 |
| 6,111,749 | A | * | 8/2000 | Lamb et al. | 361/104.33 |
| 6,269,865 | B1 | * | 8/2001 | Huang | 165/104.33 |

* cited by examiner

*Primary Examiner*—Gregory Thompson
(74) *Attorney, Agent, or Firm*—Blakely, Sokoloff, Taylor & Zafman LLP

(57) ABSTRACT

A system including a vapor chamber including a liquid. The vapor chamber is coupled with a die. The vapor chamber is attached to a plurality of micro pipes (MPs). When heat is generated by the die, the liquid is vaporized in the vapor chamber generating vapor. The vapor flows through the MPs to condensation ends of the MPs.

22 Claims, 4 Drawing Sheets

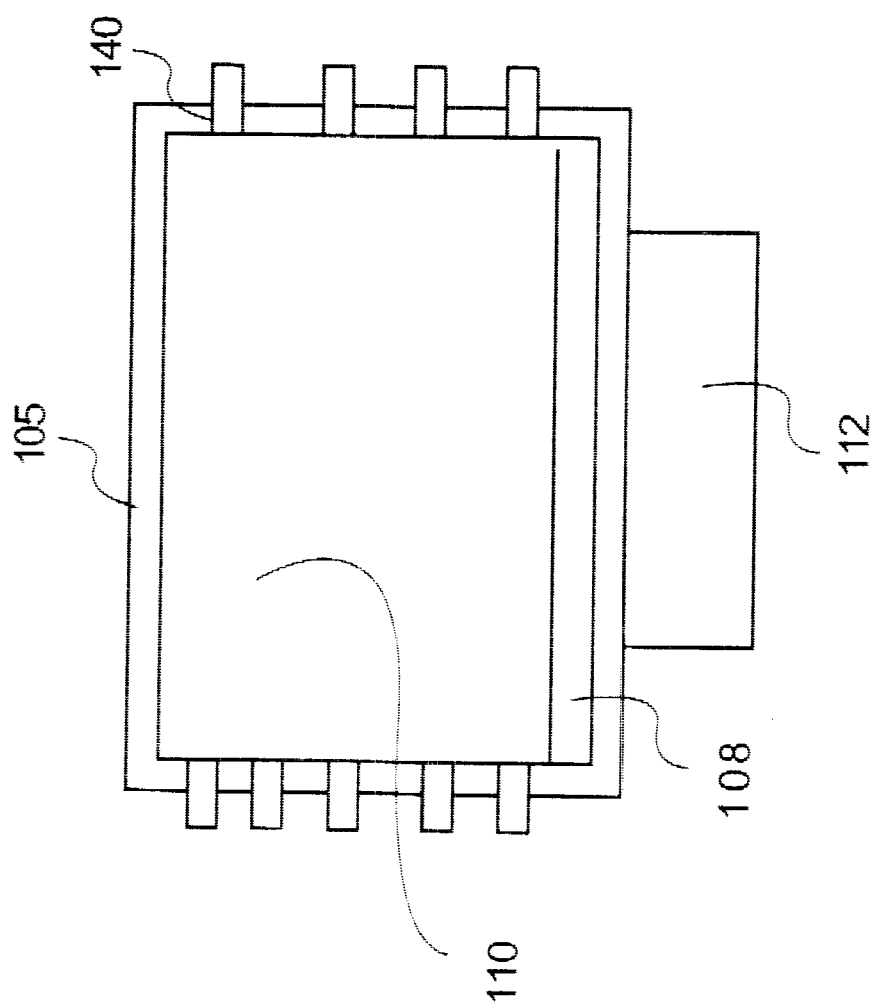

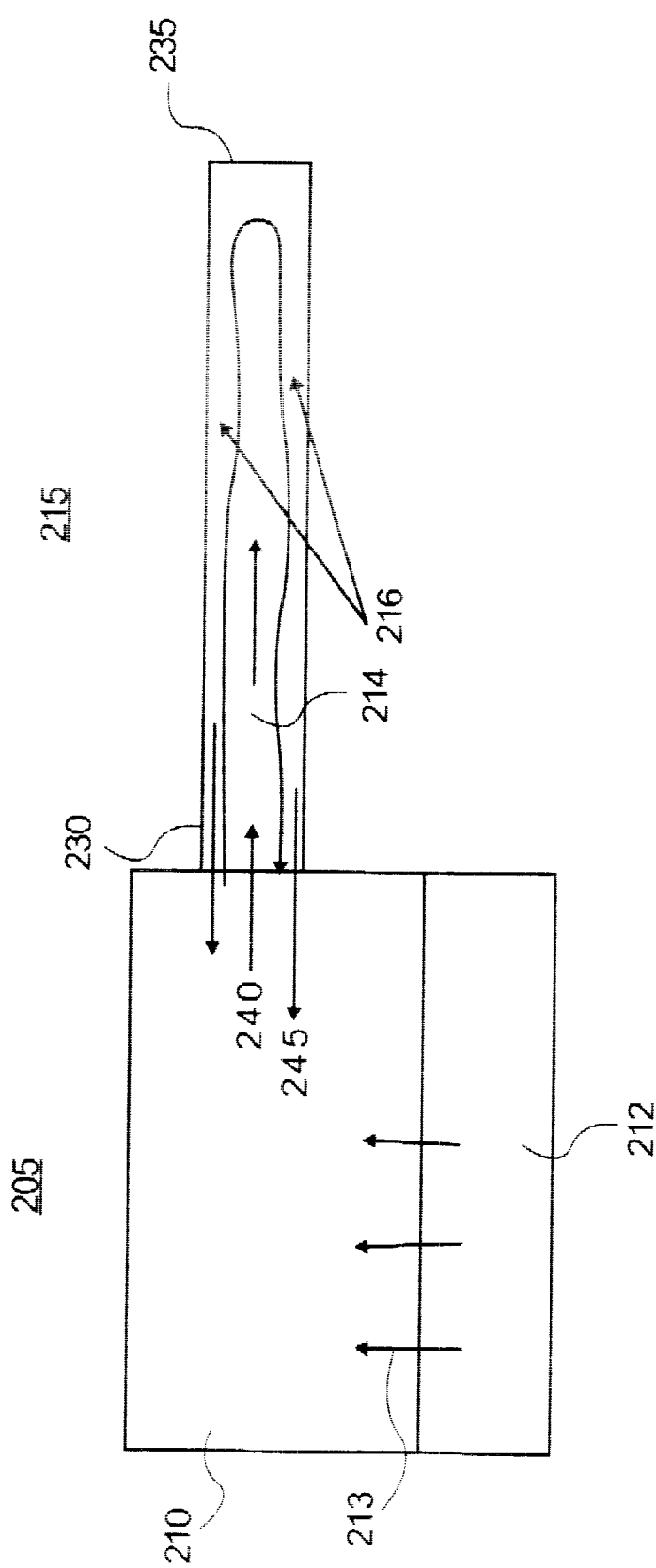

VAPOR CHAMBER SYSTEM FOR COOLING MOBILE COMPUTING SYSTEMS

FIELD OF THE INVENTION

The invention is related to the field of thermal technology, and more specifically to cooling mobile computing systems using vapor chamber.

BACKGROUND

Electronic components from microprocessors to high-end power converters generate heat. The rejection of this heat is necessary for their optimum and reliable operation. As electronic design allows higher throughput in smaller packages, dissipating the heat load becomes a critical design factor.

There are different ways of dissipating heat. These include radiation, conduction and convection. Radiation means that the heat is simply radiated away from the object, through electromagnetic radiation. Conduction is the exchange of kinetic energy between molecules. Less energetic (lower temperature) particles gain kinetic energy by colliding with more energetic particles (through physical contact).

Convection is heat transfer by movement of a heated substance (gas or liquid). This means that the heat is transferred to the molecules of the gas (or liquid) surrounding the hot object, and then transported away through movement of molecules. When the gas or liquid around the object is forced into movement (e.g., by a fan blowing air across a heat sink), then it is forced convection. Many of today's electronic devices require cooling beyond the capability of standard metallic heat sinks.

One cooling approach uses vapor chambers. The vapor chamber loses heat within the computing system by convection and radiation. Typically, a vapor chamber is a vacuum vessel with a wick structure lining the inside walls that is saturated with a working liquid. As heat is applied, the fluid at that location immediately vaporizes and the vapor rushes to fill the vacuum. Wherever the vapor comes into contact with a cooler wall surface, it will condense, releasing its latent heat of vaporization. The condensed fluid returns to the heat source via capillary action, ready to be vaporized again and repeat the cycle. The capillary action of the wick lining the inside walls enables the vapor chamber to work in any orientation with respect to gravity.

One disadvantage of the vapor chamber is its lack of flexibility. Also, the vapor chamber needs to be connected to the heat sink through another thermal attach which can increase thermal resistance.

BRIEF DESCRIPTION OF THE DRAWINGS

The present invention is illustrated by way of example, and not limitation, in the figures of the accompanying drawings in which:

FIG. 1A is a diagram illustrating one example of a vapor chamber in accordance with the present invention.

FIG. 2 is a diagram illustrating one example of an operation of a vapor chamber cooling system.

DETAILED DESCRIPTION

Figure 1B:
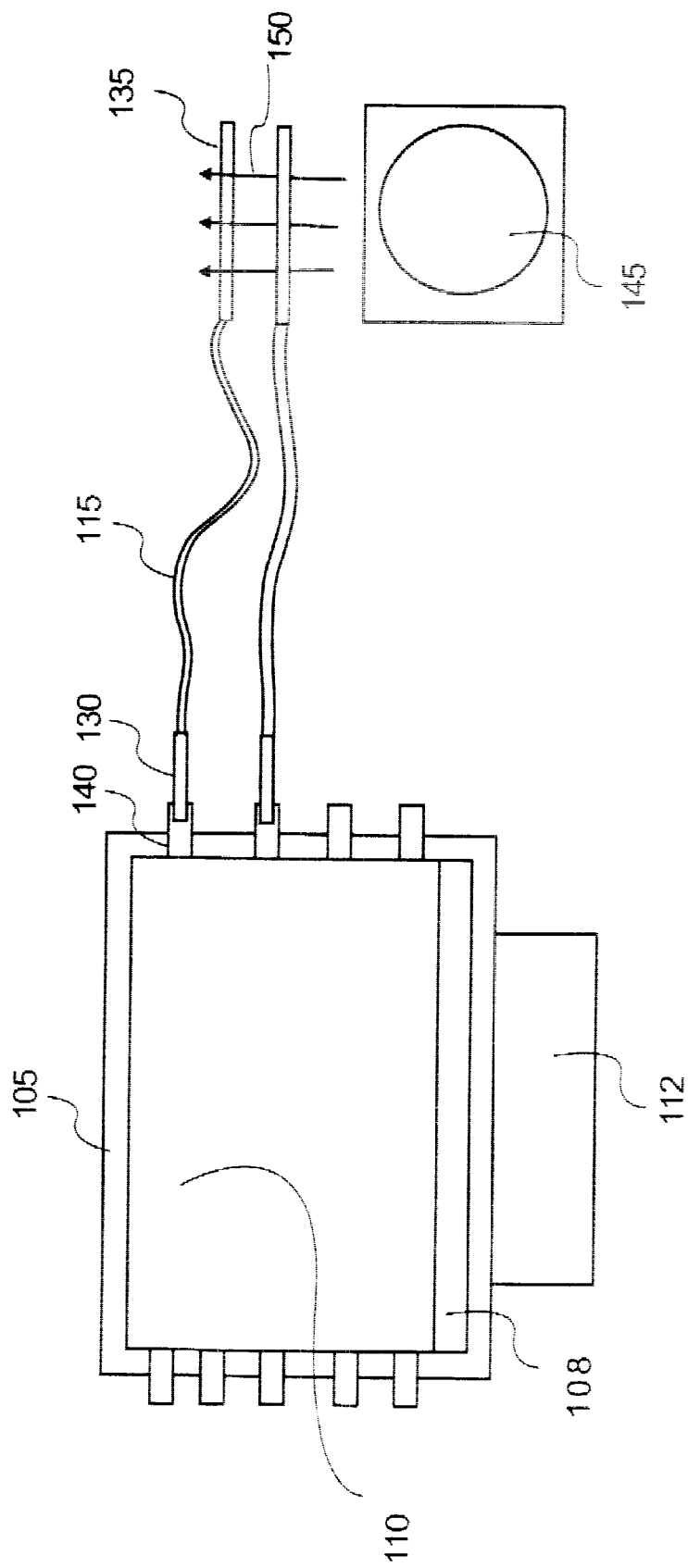
FIG. 1B is a diagram illustrating one example of a cooling system using a vapor chamber and multiple micro pipes.

In one embodiment, a method of and a system for cooling using a vapor chamber together with multiple micro pipes (MPs) are disclosed. Vapor from the vapor chamber flows into the connected MPs to condensation ends of the MPs where it is condensed into working liquid. The working liquid is returned to the vapor chamber by capillary action in the inside walls of the MPs.

The following detailed description sets forth numerous specific details to provide a thorough understanding of the invention. However, those of ordinary skill in the art will appreciate that the invention may be practiced without these specific details. In other instances, well-known methods, procedures, protocols, components, algorithms, and circuits have not been described in detail so as not to obscure the invention.

FIG. 1A is a diagram illustrating one example of a vapor chamber in accordance with the present invention. The vapor chamber 105 includes a cavity section 110 containing a liquid 108 (e.g., water) that vaporizes when boiled. The vapor chamber 105 is coupled with the die 112 and absorbs heat generated by the die 112. The heat boils and vaporizes the liquid 108 in the cavity 110. The vapor chamber 105 also includes multiple vapor chamber connection points 140 to allow the vapor to escape. As will be described in more detail below, these vapor chamber connection points 140 also allow condensed liquid to return to the vapor chamber. The vapor chamber 105 is advantageous because it has low thermal resistance in vaporizing the liquid.

FIG. 1B is a diagram illustrating one example of a cooling system using a vapor chamber and multiple micro pipes. In one embodiment, connected to the vapor chamber 105 through the vapor chamber connection points 140 are micro pipes (MPs) 115. In one embodiment, each of the MPs 115 has a small cross section of length up to 1 millimeter (mm). Each of the MPs 115 has two ends 130 and 135. The end 135 is sealed and is used for heat release by condensation. The end 135 may be connected to fins of a heat exchanger (not shown). A fan 145 may be used to generate air flow 150 to cool the heat exchanger. The end 135 is also referred to as a condensation end.

The end 130 is connected to the vapor chamber 105 at a vapor connection point 140. The end 130 is an open end to draw in vapor from the vapor chamber 105 and to return condensed working liquid back into the vapor chamber 105. The end 130 is also referred to as an evaporation end. Note that each of the MPs 115 is different from the traditional heat pipes in that the each of the MPs 115 is sealed only at the condensation end 135. The evaporation end 130 is an open end so that it can be connected to the vapor chamber connection point 140 to draw in vapor. Once connected to the vapor chamber connection points 140, the vapor chamber 105 and the MPs 115 form a closed cooling system.

Each of the MPs 115 has a central insulated section made of flexible material (e.g., plastics, etc.). The small cross section of the MPs 115 and the flexible material allow the MPs 115 to easily conform to space and size constraints of mobile computing systems. The central insulated section reduces convection and radiation from the MPs 115.

In one embodiment, the MPs 115 have internal walls lined with a capillary structure or wick similar to the internal wall structures of heat pipes. As such, internal operation of the MPs 115 is similarly to those of the heat pipes including the capillary force pushing the condensed liquid from the evaporation end 135 toward the condensation end 130. Internal operation of heat pipes is known to one skilled in the art.

FIG. 2 is a diagram illustrating one example of an operation of a vapor chamber cooling system. More than one MP may be attached to the vapor chamber 205 for parallel removal of vapor from the cavity 210 of the vapor chamber 205. The vapor chamber 205 includes a working liquid 212. As heat enters the vapor chamber 205, the heat causes the working liquid 212 to vaporize. The vaporization of the working liquid 212 generates a force 213 that pushes the vapor into the cavity region 210. The vapor then escapes from the cavity region 210 into the open evaporation end 230 of the MP 215, as illustrated by direction 240.

The vaporized working fluid creates a pressure gradient, which forces the vapor to flow along the MP 215 the cooler condensation end 235 of the MP 215, where the vapor is condensed giving up its latent heat of vaporization. The condensation end 235 may be connected to a heat exchanger (not shown) where the vapor is condensed back into the working liquid. The working liquid is then returned toward the evaporation end 130 and to the vapor chamber 205, as illustrated by direction 245.

The wicking material inside the MP 215 serves as a pump to return the cooled working liquid from the condensation end 235 by capillary forces. The vapor chamber 205 and the MP 215 provide a cooling system that offers flexibility and low resistance. The MP 215 is advantageous because it is insulated, flexible and can conform to different space and size constraints.

Figure 3:
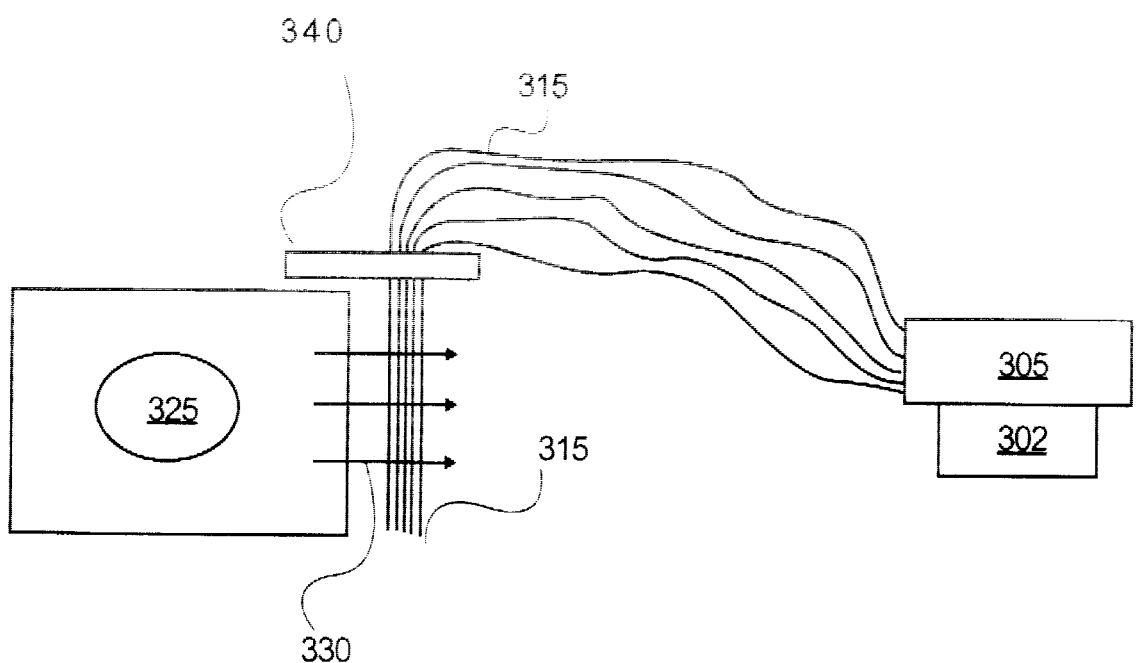
FIG. 3 is a diagram illustrating one example of using multiple condensation ends of the micro pipes as heat exchanger in a cooling system using a vapor chamber.

FIG. 3 is a diagram illustrating one example of using multiple condensation ends of the MPs as heat exchanger in a cooling system using a vapor chamber. The multiple MPs 315 are connected to the vapor chamber 305, which in turn is attached to the die 302. In one embodiment, the condensation ends 335 of the MPs 315 are metallic (e.g., copper, aluminum, etc). As described above, the condensation ends 335 are typically attached to a heat exchanger (not shown).

In one embodiment, airflow 330 generated by a fan 325 is applied toward the condensation ends 335 allowing the condensation ends 335 serve as the heat exchanger and thereby eliminating a need for a separate heat exchanger. For example, the condensation ends 335 may be attached to a holder 340 and strategically aligned to allow sufficient amount of the airflow 330 to go around the condensation ends 335. The airflow 330 serves to cool the condensations ends 335 thereby condensing the vapor back into its liquid form. Capillary force carry the working liquid through the MPs 315 back to the vapor chamber 305.

Although the invention has been described with notebook applications, one skilled in the art would recognize that the cooling system using the vapor chamber with multiple MPs may also be applied to other applications to provide more efficient heat dissipation and/or to conform with space and size constraints.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. A system, comprising:
   a die;
   a vapor chamber coupled with the die, the vapor chamber including a working liquid; and
   a plurality of micro pipes (MPs) attached to the vapor chamber at vapor chamber connection points, wherein heat generated by the die causes the working liquid in the vapor chamber to vaporize generating vapor, the vapor flowing from the vapor chamber though the MPs toward condensation ends of the MPs.

2. The system of claim 1, wherein each of the plurality of MPs has a small cross section.

3. The system of claim 2, wherein the cross section is up to 1 mm.

4. The system of claim 2, wherein each of the MPs comprises a central insulated section made of flexible material, the central insulated section having an internal surface structured to provide capillary action.

5. The system of claim 4, wherein the vapor is condensed into the working liquid at the condensation end, and wherein the working liquid is returned to the vapor chamber by the capillary action.

6. The system of claim 3, wherein the condensation end is metallic.

7. The system of claim 6, wherein the condensation end is attached to a heat exchanger.

8. The system of claim 6, wherein airflow is applied to the condensation end to provide condensation of the vapor.

9. An apparatus, comprising:
   a vapor chamber having a liquid and a cavity region; and
   multiple tubes connected to the vapor chamber at connection points on the vapor chamber, each of the multiple tubes having a vapor region and a liquid region, wherein when heat is transferred to the vapor chamber the liquid is vaporized into vapor sending the vapor into the cavity region and out into the multiple tubes at the connection points, the vapor flowing through each of the multiple tubes in the vapor region toward a condensation end of the tube where the vapor is condensed into liquid, the liquid returned in the liquid region back to the vapor chamber by capillary force.

10. The system of claim 9, wherein each of multiple tubes is a heat pipe having a central insulated section made of flexible material, the central insulated section having a capillary wicking internal surface.

11. The system of claim 10, wherein each of the multiple tubes has a cross section of length up to 1 millimeter (mm).

12. The system of claim 9, wherein the tube is sealed at the condensation end and connected to the connection point at an opposite end.

13. The system of claim 12, wherein the condensation end is metallic.

14. The system of claim 13, wherein the condensation end is attached to a heat exchanger.

15. The system of claim 13, wherein the condenation end serves as a heat exchanger by directing airflow toward the condensation end.

16. A method, comprising:
   attaching a vapor chamber to a die, the vapor chamber including a cavity region, a liquid and multiple connection points; and
   connecting a tube to each of the multiple connection points at an open end of the tube such that when heat is absorbed from the die by the vapor chamber, the liquid is vaporized into vapor, the vapor flowing into the cavity region and out to the tubes at the connection points toward a closed end of the tube.

17. The method of claim 16, wherein the closed end of the tube is metallic.

18. The method of claim 17, further comprising condensing the vapor into liquid at the closed end of the tube.

19. The method of claim 18, wherein the tube comprises a central insulated section made of flexible material, the central insulated section having a capillary wicking internal surface, wherein the liquid is returned to the vapor chamber by capillary force.

20. The method of claim 18, wherein the closed end of the tube is atached to a heat exchanger.

21. The method of claim 18, wherein the condensing the vapor comprises directing airflow to the closed end of the tube.

22. The method of claim 16, wherein the tube has a cross section of up to 1 millimeter.

\* \* \* \* \*